United States Patent
Schreffler

(10) Patent No.: US 9,237,655 B1
(45) Date of Patent: Jan. 12, 2016

(54) MATERIAL DEPOSITION ON CIRCUIT CARD ASSEMBLIES

(71) Applicant: Lockheed Martin Corporation, Grand Prairie, TX (US)

(72) Inventor: Gary J Schreffler, Winter Park, FL (US)

(73) Assignee: Lockheed Martin Corporation, Grand Prairie, TX (US)

( * ) Notice: Subject to any disclaimer, the term of this patent is extended or adjusted under 35 U.S.C. 154(b) by 218 days.

(21) Appl. No.: 13/841,067

(22) Filed: Mar. 15, 2013

(51) Int. Cl.
*B05D 5/12* (2006.01)
*H05K 3/00* (2006.01)
*H05K 3/12* (2006.01)
*B05D 1/26* (2006.01)
*B05D 1/02* (2006.01)
*C23C 4/12* (2006.01)

(52) U.S. Cl.
CPC ............... *H05K 3/0085* (2013.01); *B05D 1/26* (2013.01); *B05D 5/12* (2013.01); *H05K 3/12* (2013.01); *B05D 1/02* (2013.01); *C23C 4/12* (2013.01)

(58) Field of Classification Search
USPC .................................. 427/96.1–96.6
See application file for complete search history.

(56) References Cited

U.S. PATENT DOCUMENTS

| | | | | |
|---|---|---|---|---|
| 4,600,601 A * | 7/1986 | Tamura | | 427/96.2 |
| 4,753,819 A * | 6/1988 | Shimada | | 427/96.6 |
| 4,919,970 A | 4/1990 | Hoebener et al. | | |
| 5,148,355 A | 9/1992 | Lowe et al. | | |
| 5,658,387 A * | 8/1997 | Reardon et al. | | 118/323 |
| 5,901,898 A | 5/1999 | Strempke | | |
| 5,936,846 A | 8/1999 | Jairazbhoy et al. | | |
| 6,039,000 A | 3/2000 | Libby et al. | | |
| 6,132,809 A * | 10/2000 | Hynes et al. | | 427/96.4 |
| 7,867,555 B2 | 1/2011 | O'Dell et al. | | |
| 7,923,918 B2 | 4/2011 | Tamaki et al. | | |
| 8,236,373 B2 * | 8/2012 | Fumo | | H05K 3/061 |
| | | | | 427/284 |
| 2009/0290314 A1 | 11/2009 | Bedinger et al. | | |
| 2011/0313559 A1 | 12/2011 | Aviza et al. | | |

* cited by examiner

*Primary Examiner* — Brian K Talbot
(74) *Attorney, Agent, or Firm* — Withrow & Terranova, PLLC

(57) ABSTRACT

An apparatus includes a circuit card assembly; and a nozzle for depositing material on the circuit card assembly, the nozzle and circuit card assembly capable of being angled relative to one another. In operation, the apparatus performs a process including positioning a circuit card assembly and a nozzle for the nozzle to deposit a material on the circuit card assembly; and angling the nozzle and the circuit card assembly relative to one another to facilitate the deposition.

2 Claims, 7 Drawing Sheets

MATERIAL DEPOSITION ON CIRCUIT CARD ASSEMBLIES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND

The technique disclosed herein pertains to the deposition of materials on circuit card assemblies.

This section of this document introduces various aspects of the art that may be related to various aspects of the present invention described and/or claimed below. It provides background information to facilitate a better understanding of the various aspects of the present invention. As the section's title implies, this is a discussion of "related" art. That such art is related in no way implies that it is also "prior" art. The related art may or may not be prior art. The discussion in this section of this document is to be read in this light, and not as admissions of prior art.

Present deposition of materials on a circuit card assembly ("CCA") are by using large nozzles that do not have the capability of coating at multiple angles and deposit materials close to the interface areas.

The present invention is directed to resolving, or at least reducing, one or all of the problems mentioned above.

SUMMARY

In a first aspect, an apparatus, comprises: a circuit card assembly; and a nozzle for depositing material on the circuit card assembly, the nozzle and circuit card assembly capable of being angled relative to one another.

In a second aspect, a process, comprises: positioning a circuit card assembly and a nozzle for the nozzle to deposit a material on the circuit card assembly; and angling the nozzle and the circuit card assembly relative to one another to facilitate the deposition.

The above presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

The presently disclosed technique angles the nozzle relative to a CCA in order to deposit material onto the CCA from a variety of angles. Although, both the nozzle and the CCA may be moved in some embodiments, most embodiments will angle either the nozzle or the CCA while the other remains stationary. Some embodiments will also offset the nozzle from its dispenser to facilitate the process.

Figure 1:
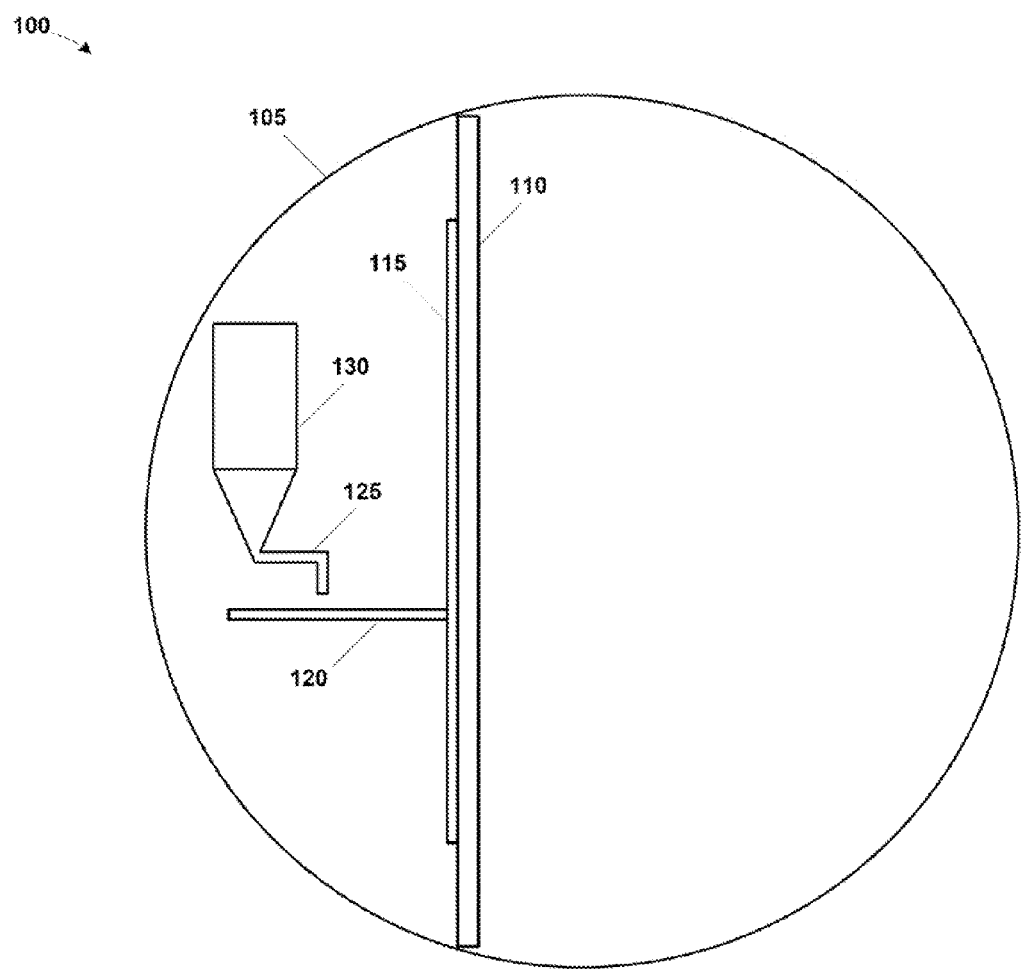
FIG. 1 conceptually illustrates one particular embodiment of a process and apparatus performed in accordance with the present invention.

FIG. 1 illustrates one particular embodiment an apparatus 100 in accordance with the presently disclosed technique. It depicts a rotary head 105 mounted to the top of an x-y table that is otherwise not shown. The rotary head 105 can rotate either clockwise or counter-clockwise in the drawing and is oriented horizontally, or roughly parallel with the floor. A CCA mounting fixture 110 is shown rising vertically from the rotary head 105. It is also shown as being off-center—i.e., as a chord rather than a diameter for the rotary head 105. This is an implementation specific detail and alternative embodiments may center the CCA mounting fixture 110.

The CCA mounting fixture 110 is designed to hold the CCA 115. It may be CCA specific or a universal fixture depending on the implementation. It is designed such that components may be placed on either side of the CCA in the illustrated embodiment. The fixture has all the tooling features to mount to the CCA mounting fixture 110 to a mounting plate or the machine bed, neither of which are shown for this particular embodiment. The CCA mounting fixture to mounting plate mounts to the rotary head 105 and is designed to reduce vibration into the CCA 115. The rotary head 105 allows for contiguous material deposition up the sides of tall components.

A first CCA 115 is shown mounted to the CCA mounting fixture 110. The first CCA 115 may be mounted to the CCA mounting fixture 110 using, for example, fasteners or edge clamps. A second CCA 120 is shown then extending laterally from the first CCA 115 mounted to the CCA mounting fixture 110. In the illustrated embodiment, the material is deposited on the second CCA 120. Alternative embodiments may deposit material directly on the first CCA 115 affixed to the CCA mounting fixture 110. Thus, in some embodiments, there may be only a single CCA and the material is deposited directly thereon.

Figure 4:
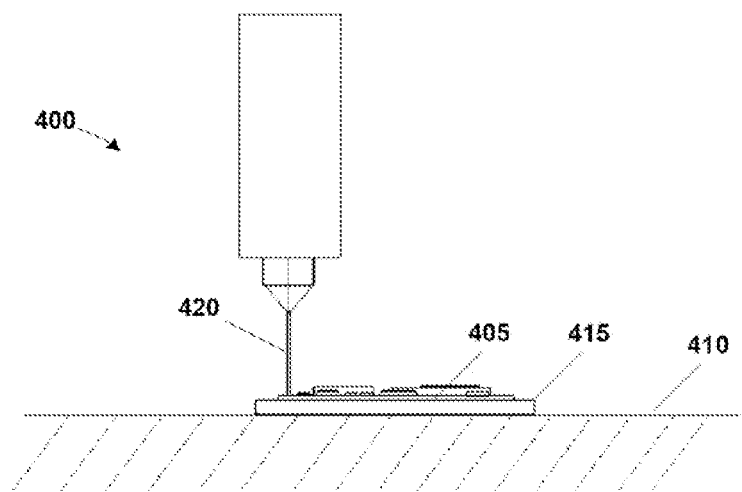
FIG. 4 depicts an alternative embodiment in which the CCA on which the deposition occurs is mounted directly to the mounting fixture.

For example, in the embodiment 400 of FIG. 4, a CCA 405 is mounted directly to a rotary head 410 of a table not otherwise shown. The CCA 405 is mounted to the rotary head 410 410 by way of a CCA fixture 415. The CCA 405 can then be rotated relative to the nozzle 420 to facilitate the deposition of materials thereon as described elsewhere herein.

The nozzle 125 shown in FIG. 1 is shown offset from its dispenser 130. This is not required for the practice of the invention. Some embodiments may use a nozzle that is not offset such as the nozzle 420 in FIG. 4. However, the offset does provide some extra room for the rotation of the CCA mounting fixture 110 and the CCA 120 by the rotary head 105, thus providing a wider range of angles for the deposition process. The angled nozzle may be used when the clearance to the rotary head 105 is an issue and/or reconfiguring the pump position negatively impacts deposition time. Also, depending on component closeness and heights, an angled head may not be appropriate. Shorter nozzle lengths are in some contexts preferable to longer nozzle lengths due to increased pump pressures.

The dispenser 130 translates on the z-axis, left to right, and, into and out of the paper as viewed in FIG. 1. In the illustrated embodiment, it is angled relative to the z-axis although the nozzle 125 is not.

In operation, the nozzle 125 deposits the material (not shown) on the second CCA 120. The deposition may be, for example, a spray or a conformal coating to deposit, for another example, a conductive ink or a dielectric polymer. The deposition technique and the identity of the materials may accord with conventional practice other than as described herein.

During the deposition, there may be times when a direct, conventional application may not provide the coverage desired. The presently disclosed technique angles the nozzle 125 and the CCAs relative to one another to facilitate the deposition. In the illustrated embodiment, this is accomplished by rotating the CCA or multiple CCAs using the rotary head 105. The rotation may be either clockwise or counterclockwise depending on the desired angle. Note that the physical dimensions and the physical relationship of the nozzle 125 and the CCAs will limit rotation and, thus, achievable angle.

Some embodiments may, however, move the nozzle 125 relative to the CCA or multiple CCAs instead. This may be accomplished by mounting the nozzle 125 using a rotational joint, for example. Some embodiments may also move both the nozzle 125 and the CCA, although this would be more complicated.

Figure 5:
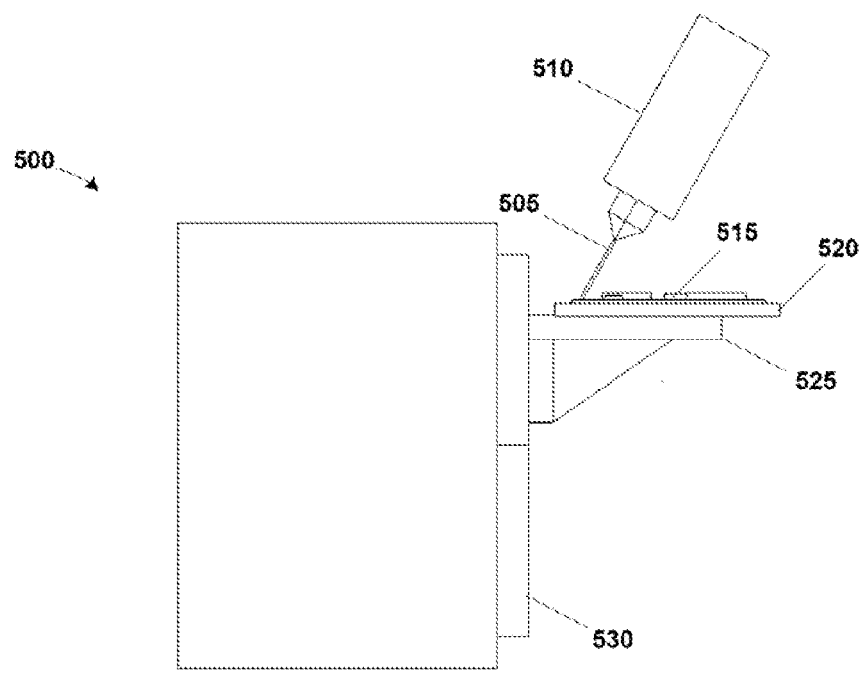
FIG. 5 depicts an alternative embodiment in which the nozzle is rotated relative to the CCA.
Figure 6A:
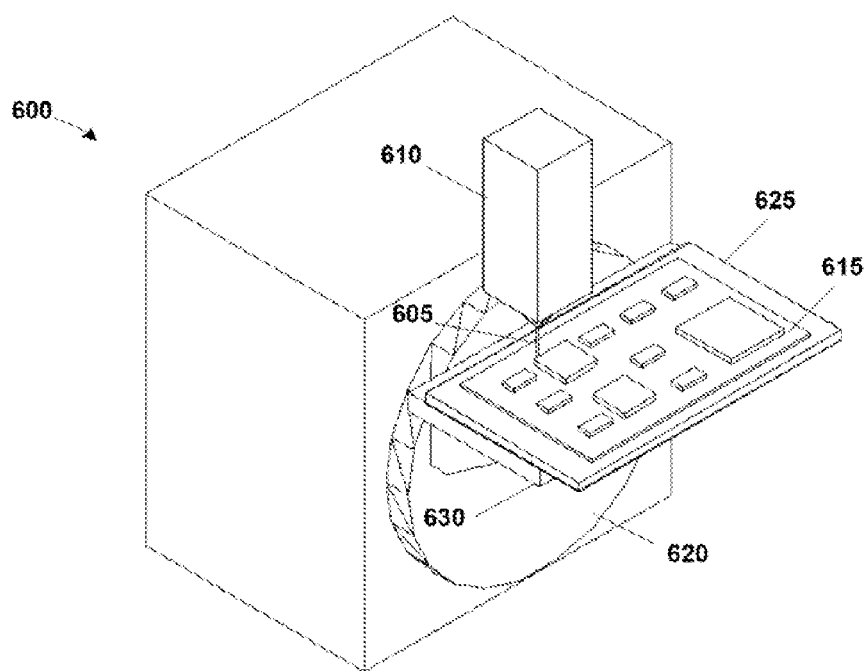
FIG. 6A-FIG. 6D illustrate one particular embodiment in perspective, side plan, top plan, and front plan views, respectively.
Figure 6B:
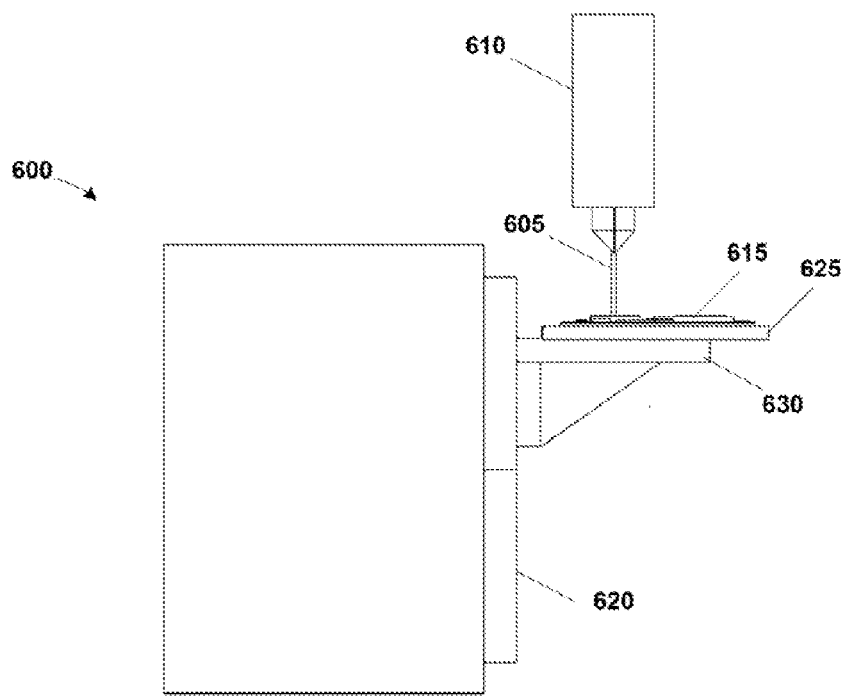
Figure 6C:
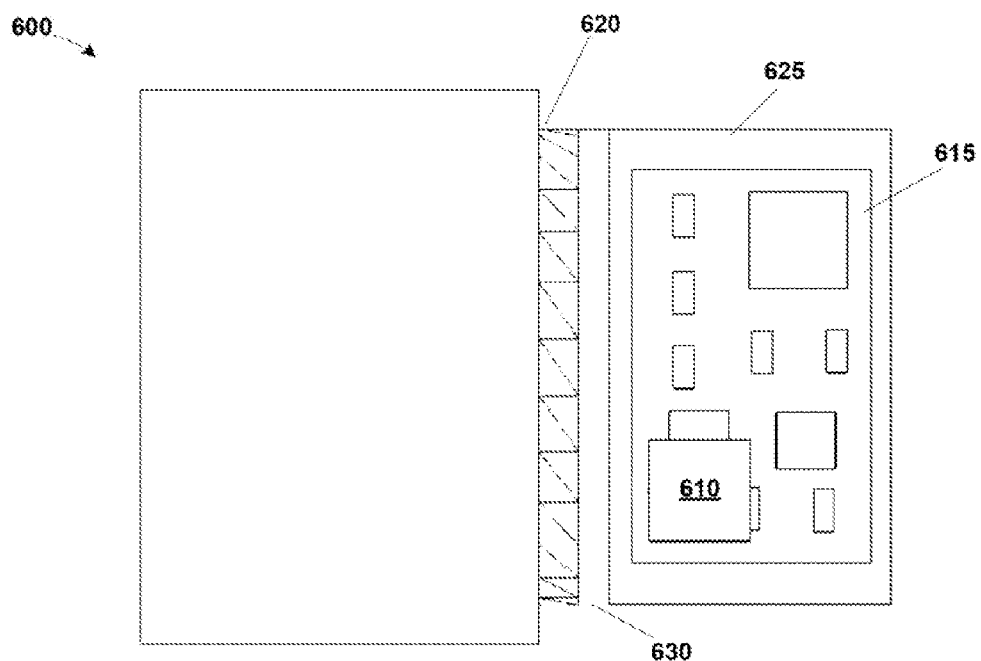
Figure 6D:
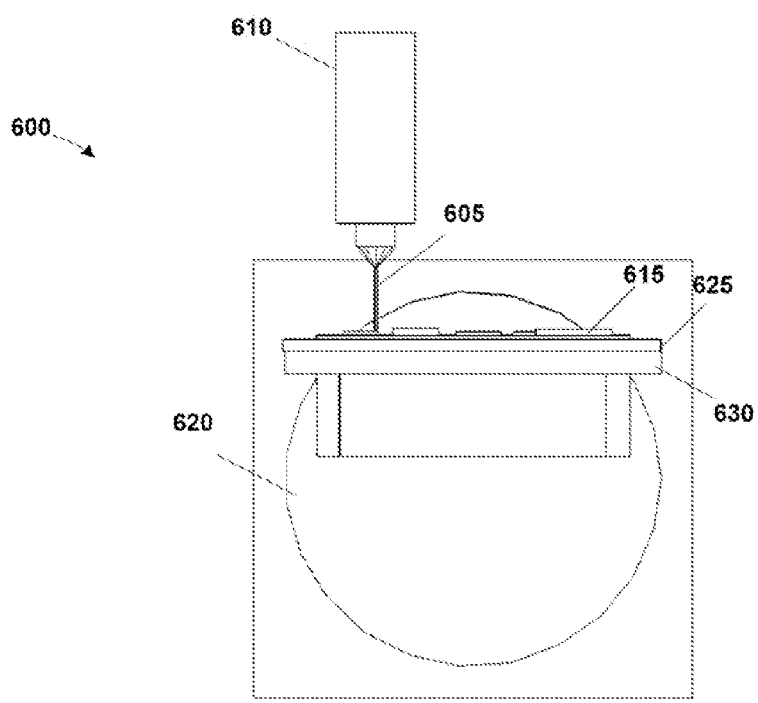
Figure 7A:
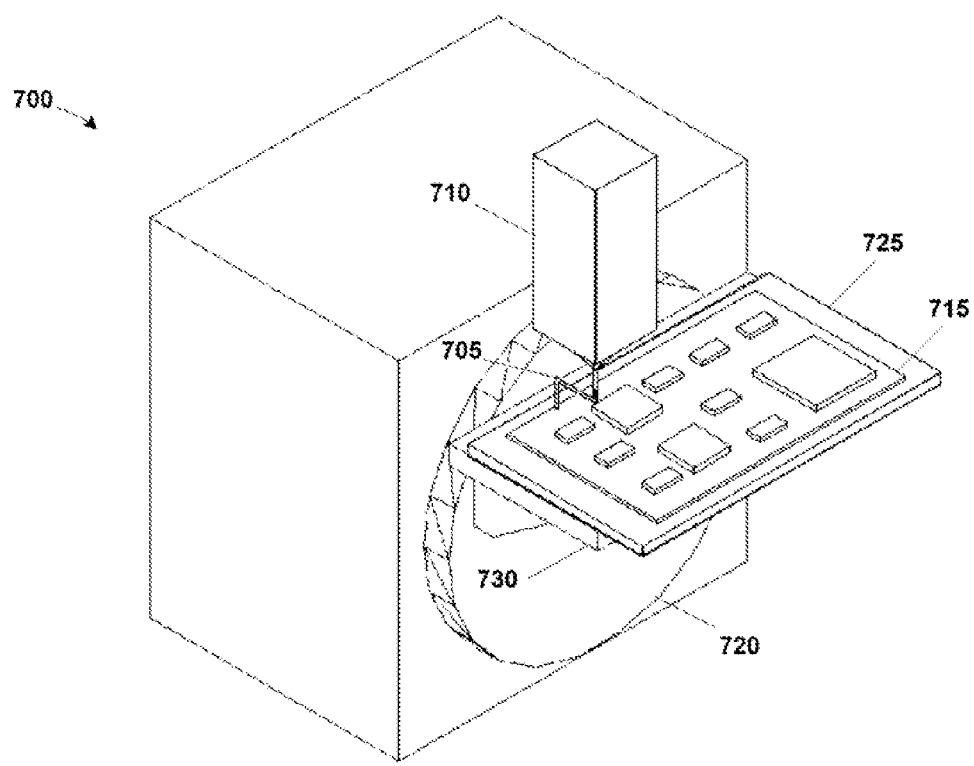
FIG. 7A-FIG. 7D illustrate one particular embodiment alternative to that in FIG. 6A-FIG. 6D in perspective, side plan, top plan, and front plan views, respectively.
Figure 7B:
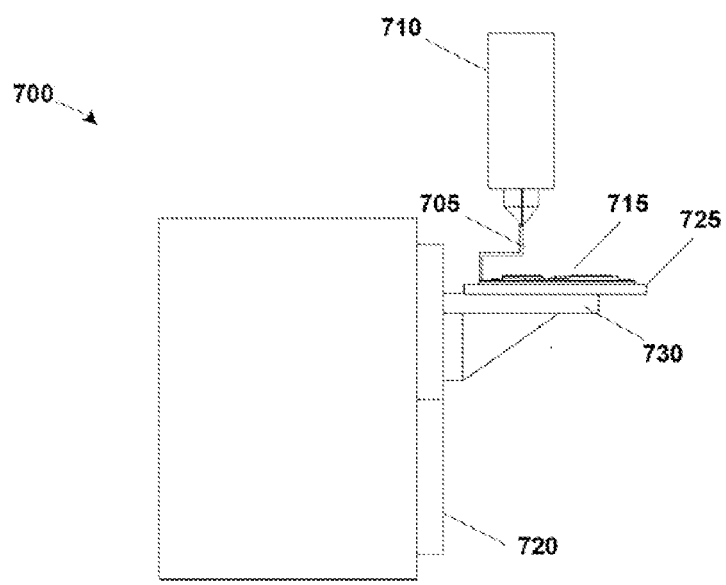
Figure 7C:
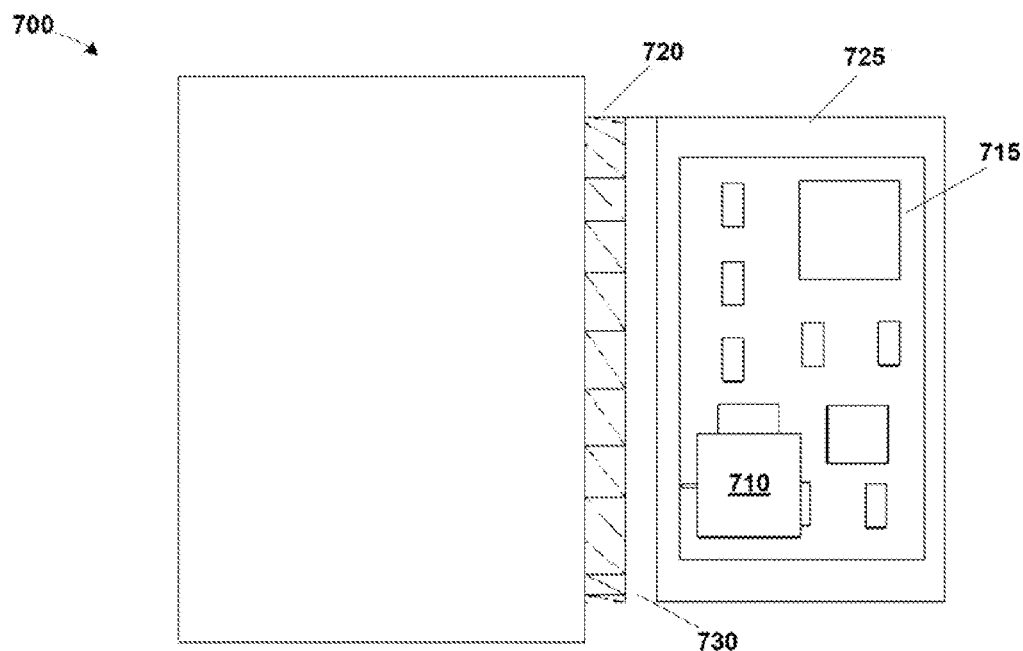
Figure 7D:
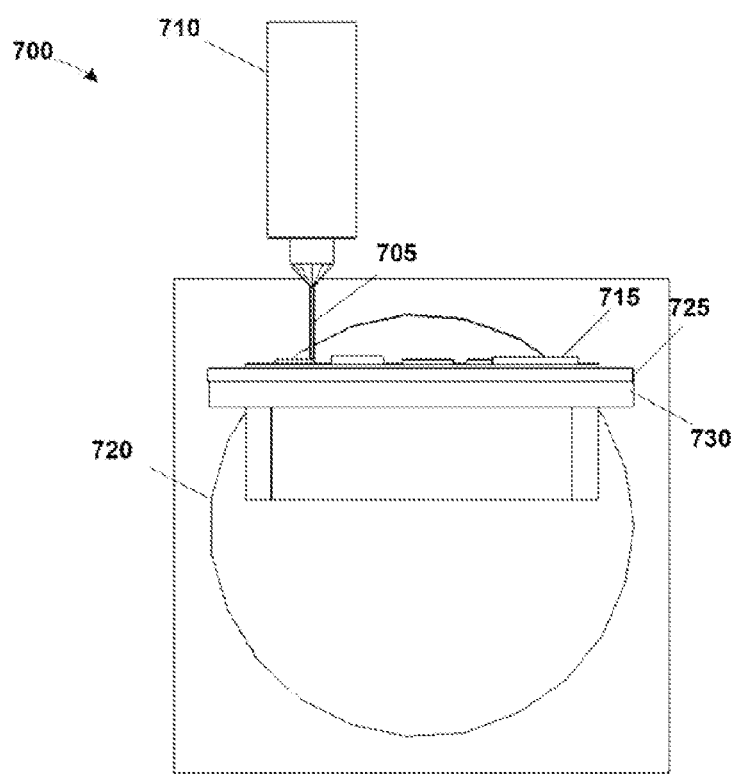

One such embodiment 500 is shown in FIG. 5. In the embodiment 500, the nozzle 505 and dispenser 510 are mounted to a motor-driven rotational joint (not shown). The CCA 515 is mounted via a mounting fixture 520 to a mounting plate 525 extending from the rotary head 530. The nozzle 505 and dispenser 510 can therefore be rotated relative to the CCA 515 as shown using the rotational joint. Note that the CCA 515 can also be rotated relative to the nozzle 505 in this particular embodiment. Additional range of motion can be achieved by, for example, mounting the nozzle 505 and dispenser 510 to a universal joint permitting a full 360° range of motion.

Returning to FIG. 1, the rotary head 105 and CCA mounting fixture 110 therefore constitute, by way of example and illustration, a means for angling the nozzle 125 and the circuit card assembly relative to one another to facilitate the deposition. This is but one means, and alternative embodiments may employ structural equivalents that perform this function. Some embodiments may also employ still other means to effect this functionally.

The nozzle 125 is "capable of" being angled in the sense that it may not be angled at all times during the deposition process. As those in the art having the benefit of this disclosure will appreciate, at some points during the deposition process, the nozzle 125 will not be angled relative to the CCA whereas at other time it will be. Furthermore, when the apparatus is not in operation or is otherwise powered down, the nozzle 125 likely will not be angled relative to the CCA. Accordingly, the phrase "capable of" conveys the notion that the nozzle 125 will be angled at some times and will not be at other times.

Figure 2:
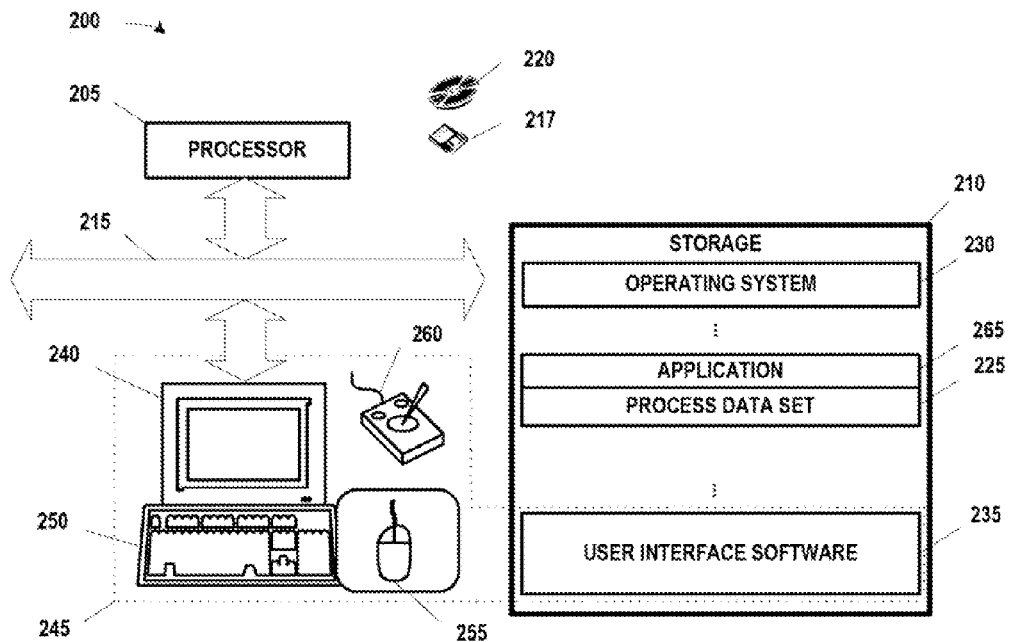
FIG. 2 shows selected portions of the hardware and software architecture of a computing apparatus such as may be employed in some aspects of the present invention.

In one aspect, the presently disclosed technique includes a software implemented method for controlling the material deposition process. FIG. 2 shows selected portions of the hardware and software architecture of a computing apparatus 200 such as may be employed in some aspects of the present invention. The computing apparatus 200 includes a processor 205 communicating with storage 210 over a bus system 215. The storage 210 may include a hard disk and/or random access memory ("RAM") and/or removable storage such as a floppy magnetic disk 217 and an optical disk 220.

The storage 210 is encoded with a process data set 225. The storage 210 is also encoded with an operating system 230, user interface software 235, and an application 265. The user interface software 235, in conjunction with a display 240, implements a user interface 245. The user interface 245 may include peripheral I/O devices such as a keypad or keyboard 250, a mouse 255, or a joystick 260. The processor 205 runs under the control of the operating system 230, which may be practically any operating system known to the art. The application 265 is invoked by the operating system 230 upon power up, reset, or both, depending on the implementation of the operating system 230. The application 265, when invoked, performs the method of the present invention. The user may invoke the application in conventional fashion through the user interface 245.

Figure 3:
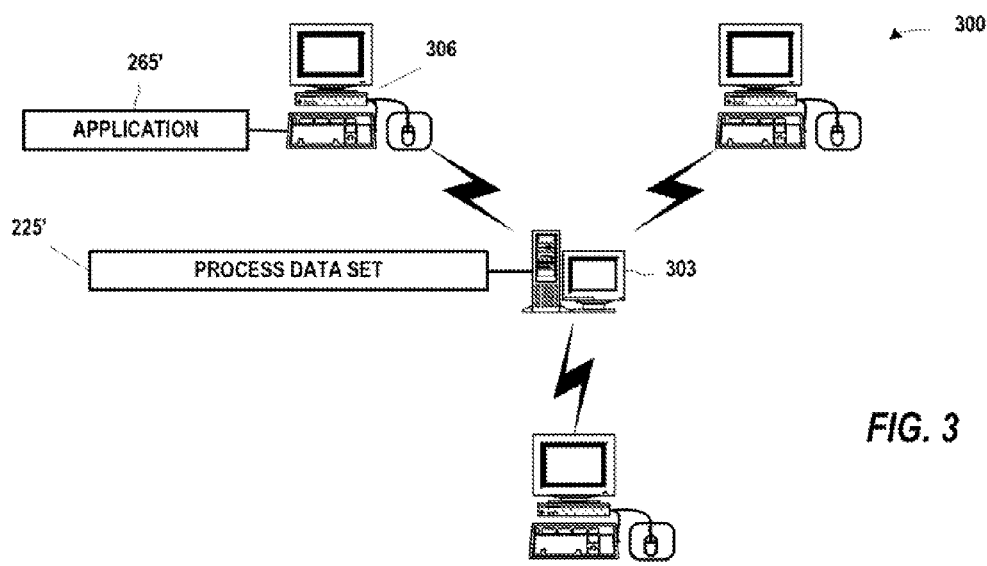
FIG. 3 illustrates a computing system on which some aspects of the present invention may be practiced in some embodiments.

Note that there is no need for the process data set 225 to reside on the same computing apparatus 200 as the application 265. Some embodiments of the present invention may therefore be implemented on a computing system, e.g., the computing system 300 in FIG. 3, comprising more than one computing apparatus. For example, the process data set 225 may reside in a data structure residing on a server 303 and the application 265' by which it is processed on a workstation 306 where the computing system 300 employs a networked client/server architecture.

However, there is no requirement that the computing system 300 be networked. Alternative embodiments may employ, for instance, a peer-to-peer architecture or some hybrid of a peer-to-peer and client/server architecture. The size and geographic scope of the computing system 300 is not material to the practice of the invention. The size and scope may range anywhere from just a few machines of a Local Area Network ("LAN") located in the same room to many hundreds or thousands of machines globally distributed in an enterprise computing system.

Some portions of the detailed descriptions herein are consequently presented in terms of a software implemented process involving symbolic representations of operations on data bits within a memory in a computing system or a computing device. These descriptions and representations are the means used by those in the art to most effectively convey the substance of their work to others skilled in the art. The process and operation require physical manipulations of physical quantities that will physically transform the particular machine or system on which the manipulations are performed or on which the results are stored. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated or otherwise as may be apparent, throughout the present disclosure, these descriptions refer to the action and processes of an electronic device, that manipulates and transforms data represented as physical (electronic, magnetic, or optical) quantities within some electronic device's storage into other data similarly represented as physical quantities within the storage, or in transmission or display devices. Exemplary of the terms denoting such a description are, without limitation, the terms "processing," "computing," "calculating," "determining," "displaying," and the like.

Furthermore, the execution of the software's functionality transforms the computing apparatus on which it is performed. For example, acquisition of data will physically alter the content of the storage, as will subsequent processing of that data. The physical alteration is a "physical transformation" in that it changes the physical state of the storage for the computing apparatus.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

FIG. 6A-FIG. 6D illustrate one particular embodiment 600 in perspective, side plan, top plan, and front plan views, respectively. In the embodiment 600, the nozzle 605 is not offset from the dispenser 610. The nozzle 605 and dispenser 610 are not mounted by a rotational joint and so do not rotate relative to the CCA 615. However, they may in variations on this embodiment. The CCA 615 is mounted to the rotary head 620 via the mounting fixture 625 and the mounting plate 630.

FIG. 7A-FIG. 7D illustrate one particular embodiment 700 alternative to that in FIG. 6A-FIG. 6D in perspective, side plan, top plan, and front plan views, respectively. The nozzle 705 is offset from the dispenser 710 as with the embodiment of FIG. 1. The nozzle 705 and dispenser 710 are not mounted by a rotational joint and so do not rotate relative to the CCA 715. However, they may in variations on this embodiment. The CCA 715 is mounted to the rotary head 720 via the mounting fixture 725 and the mounting plate 730.

In operation, each of the embodiments above performs a process for depositing a material on a CCA. Referring now to FIG. 1 for purposes of illustration, the method begins by positioning the CCA 120 and the nozzle 125 for the nozzle 125 to deposit a material (not shown) on CCA 120. The nozzle 125 and the CCA 120 are then angled relative to one another to facilitate the deposition. This may involve angling the nozzle 125 relative to the CCA 120, or angling the CCA 120 relative to the nozzle 125, or angling both of them.

The material can then be deposited on the CCA 125. The material may be a conductive ink or a dielectric polymer, for example. It can be deposited by spraying the material or depositing a conformal coating. During the deposition, the relative angle between the nozzle 125 and CCA 120 will facilitate a precise and even deposition.

In the embodiments illustrated above, the dispenser and nozzle are implemented using commercial available, off the shelf versions of the nScrypt Direct Print Dispensing System and variants thereof. As noted above, some embodiments will modify the conventional nozzle by offsetting it relative to the dispenser. Additional information regarding commercially available dispensing systems of this type is available from nScrypt, Inc. manufactures micro dispensing pumps and micro dispensing systems. They may be contacted at 12151 Research Pkwy, Suite 150, Orlando, Fla. 32826; Ph: 407-275-4720; Fax: 407-275-4759, email: info@nscrypt.com. Information is also available from their website at www.nscrypt.com. However, the invention is not so limited and any suitable dispensing system known to the art may be used.

To the extent that any incorporated application, patent, or other reference contradicts or otherwise conflicts with the present disclosure, the present disclosure controls.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A process for depositing a material on a circuit card assembly, comprising:
   mounting a circuit card assembly to a rotatable mounting assembly, the circuit card assembly comprising a circuit card that comprises a component;
   depositing a first conductive trace onto the circuit card via a nozzle having a longitudinal axis;
   detecting the component on the circuit card;
   rotating the circuit card to alter an angle of the longitudinal axis with respect to a plane that is parallel to the circuit card and that intersects the circuit card;
   depositing a second conductive trace that is conductively coupled to the first conductive trace along a first side of the component;
   rotating the circuit card to alter the angle of the longitudinal axis with respect to the plane that is parallel to the circuit card and that intersects the circuit card;

depositing a third conductive trace that is conductively coupled to the second conductive trace along a top of the component;

rotating the circuit card to alter the angle of the longitudinal axis with respect to the plane that is parallel to the circuit card and that intersects the circuit card; and depositing a fourth conductive trace that is conductively coupled to the third conductive trace along a second side of the component.

2. The process of claim 1, further comprising:

mounting a second circuit card assembly to a second mounting assembly, the second circuit card assembly comprising a second circuit card;

depositing the material onto the second circuit card assembly via the nozzle; and causing an angle of a second longitudinal axis with respect to a plane that is parallel to the second circuit card and that intersects the second circuit card to differ while depositing the material onto the second circuit card assembly.

* * * * *